US010002951B2

(12) United States Patent
Soeno

(10) Patent No.: US 10,002,951 B2
(45) Date of Patent: Jun. 19, 2018

(54) SEMICONDUCTOR DEVICE

(71) Applicant: TOYOTA JIDOSHA KABUSHIKI KAISHA, Toyota-shi, Aichi-ken (JP)

(72) Inventor: Akitaka Soeno, Toyota (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 0 days. days.

(21) Appl. No.: 15/180,772

(22) Filed: Jun. 13, 2016

(65) Prior Publication Data

US 2017/0162680 A1    Jun. 8, 2017

(30) Foreign Application Priority Data

May 26, 2015 (JP) .................................. 2015-106494

(51) Int. Cl.
  *H01L 29/41*    (2006.01)
  *H01L 29/739*   (2006.01)
  *H01L 29/10*    (2006.01)
  *H01L 29/06*    (2006.01)

(52) U.S. Cl.
  CPC ...... *H01L 29/7397* (2013.01); *H01L 29/0634* (2013.01); *H01L 29/1095* (2013.01)

(58) Field of Classification Search
  CPC ............. H01L 29/7397; H01L 29/0634; H01L 29/1095; H01L 29/7813; H01L 29/0696; H01L 29/0865; H01L 29/7811; H01L 29/7802
  See application file for complete search history.

(56) References Cited

U.S. PATENT DOCUMENTS

| 2011/0210391 A1 | 9/2011 | Kitagawa |
| 2012/0313164 A1* | 12/2012 | Senoo ................. H01L 29/1095 257/330 |
| 2014/0054645 A1* | 2/2014 | Saito ................... H01L 29/0696 257/139 |

FOREIGN PATENT DOCUMENTS

| JP | 2011-165928 A | 8/2011 |
| JP | 5604892 B2 | 10/2014 |

* cited by examiner

*Primary Examiner* — Cuong B Nguyen
*Assistant Examiner* — Samuel Park
(74) *Attorney, Agent, or Firm* — Hunton Andrews Kurth LLP

(57) ABSTRACT

A semiconductor device may include a trench, a gate insulating film covering the trench, first conductive type carrier-injected regions intermittently appearing along a predetermined direction, a first conductive type drift region continuously present along the predetermined direction, a second conductive type body region filling a gap between the carrier-injected regions as seen along the predetermined direction, and a gate electrode disposed in the trench. A front end surface located on the front surface side of the gate electrode may include a first end surface at a portion of the gate electrode opposing the carrier-injected regions via the gate insulating film, and a second end surface at least a part of a portion of the gate electrode opposing the body region in the gap. The second end surface may be displaced to the rear surface side relative to the first end surface.

5 Claims, 9 Drawing Sheets

SEMICONDUCTOR DEVICE

CROSS-REFERENCE TO RELATED APPLICATION

This application claims priority to Japanese Patent Application No. 2015-106494 filed on May 26, 2015, the contents of which are hereby incorporated by reference into the present application.

TECHNICAL FIELD

The technique disclosed herein related to a semiconductor device.

BACKGROUND ART

Japanese Patent Application Publication No. 2011-165928 discloses a semiconductor device including trench gate electrodes. In this semiconductor device, a trench extending from a front surface to a rear surface of a semiconductor substrate, and a gate insulating film covering a bottom surface and a side surface of the trench are provided. Inside the semiconductor substrate, a first conductivity type carrier-injected region making contact with the side surface of the trench at a front surface side (which, in the case of Japanese Patent Application Publication No. 2011-165928, is configured as an emitter region in IGBT. The same would be a source region for MOS), a drift region making contact with the bottom surface and side surface at a rear surface side of the trench, and a second conductivity type body region located between the first conductivity type carrier-injected region and the first conductivity type drift region and separating them are provided. In this semiconductor device, the carrier-injected region and the drift region are electrically connected by applying a potential to the trench gate electrode, the potential which inverts a part of the body region to a first conductivity type.

SUMMARY

A phenomenon in which a voltage is applied to a gate electrode and an inversion layer is generated at a position opposing the gate electrode via a gate insulating film corresponds to a phenomenon of storing charges in one electrode of a capacitor and causing a dielectric phenomenon in the other electrode of the capacitor. A charge amount which needs to he stored in the gate electrode to form such an inversion layer is called a gate-input charge amount.

In order to facilitate fast-speed switching in a switching device, such as IGBT or MOS, which uses gate electrodes, the gate-input charge amount needs to be kept small. The gate-input charge amount becomes smaller when an area of the gate electrode opposing a semiconductor substrate via the gate insulating film (which may hereinbelow be referred to as "opposing area") becomes less. The gate-input charge amount becomes smaller for less opposing area included in a unit area in a plan view of the semiconductor substrate.

An aforementioned opposing part is a part necessary for the generation of the inversion layer, and an excessive decrease in the opposing area leads to deterioration in a semiconductor device performance. The maintenance of the semiconductor device performance by securing the opposing area and the reduction of the gate-input charge amount by decreasing the opposing area stand in a contradictory relationship, and it is difficult to satisfy both of them.

When seeing the semiconductor substrate in the plan view, a trench extends in a predetermined direction. To improve the semiconductor device performance, there is a known structure in which the aforementioned carrier-injected region is not provided continuously in the predetermined direction, but carrier-injected regions appear intermittently. In this case, a gap between the carrier-injected regions is filled by a second conductivity type region.

As a result of various considerations, it has been found that, in the semiconductor device of the above configuration, both of the maintenance of the semiconductor device performance by securing the opposing area and the reduction of the gate-input charge amount by decreasing the opposing area can be satisfied. The technique disclosed herein has been developed based on the above finding.

A semiconductor device disclosed herein comprises: a trench extending from a front surface of a semiconductor substrate toward a rear surface of the semiconductor substrate, and extending in a predetermined direction in a plan view of the semiconductor device; and a gate insulating film covering a bottom surface and a side surface of the trench; first conductive type carrier-injected regions (in case of bipolar, emitter regions, and in case of unipolar, source regions) being in contact with the side surface of the trench that is located on a front surface side, and intermittently appearing as seen along the predetermined direction; a first conductive type drift region being in contact with the bottom surface and the side surface of the trench that is located on a rear surface side, and continuously present as seen along the predetermined direction; a second conductive type body region disposed between the first conductive type carrier-injected regions and the first conductive type drift region and separating the first conductive type carrier-injected regions and the first conductive type drift region, and filling a gap between the first conductive type carrier-injected regions as seen along the predetermined direction; and a gate electrode disposed in the trench having the bottom surface and the side surface covered by the gate insulating film. The gate electrode has a front end surface located on the front surface side of the trench, the front end surface including: a first end surface that is at a portion of the gate electrode opposing the first conductive type carrier-injected regions via the gate insulating film, and a second end surface that is at least a part of a portion of the gate electrode opposing the second conductive type body region in the gap, and the second end surface is displaced to the rear surface side relative to the first end surface.

In the above semiconductor device, the second end surface that is at least at a portion of the gate electrode located at the position opposing the body region via the gate insulating film is displaced to the rear surface side as compared to the first end surface of the gate electrode located at the position opposing the carrier-injected regions via the gate insulating film. According to this configuration, as compared to a configuration in which the end surface of the gate electrode at the position opposing the body region is located at a same height as the end surface of the gate electrode at the position opposing the carrier-injected regions, the opposing area between the gate electrode and the body region may be made small at the position opposing the body region.

Further, in the semiconductor device as above, the gate insulating film makes contact with the body region that separates the carrier-injected regions and the drift region, so an inversion layer may he generated at a position where the inversion layer needs to be generated. On the other hand, in the body region that is between the carrier-injected regions and the drift region, a range where the gate electrode is not opposed thereto may be generated, however, the inversion layer does not need to be generated at such a position, and the semiconductor device performance will not be deteriorated even if the opposing positional relationship is not provided at this position. According to this configuration, a gate-input charge amount may be made small without deteriorating the semiconductor device performance.

DETAILED DESCRIPTION

First Embodiment

Figure 1:
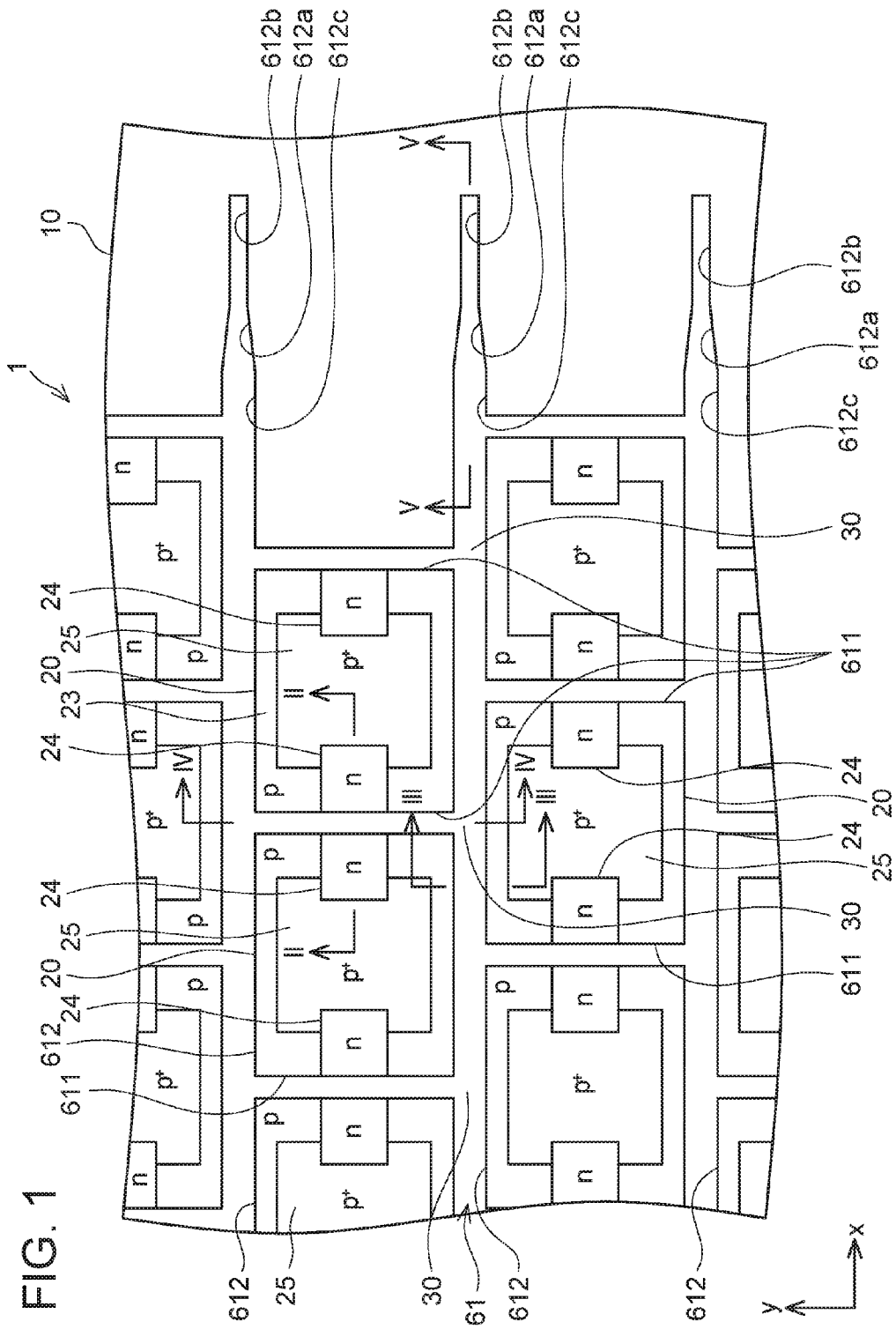
FIG. 1 is a plan view of a semiconductor device.

A semiconductor device 1 shown in FIG. 1 to FIG. 6 is IGBT. The semiconductor device 1 includes a semiconductor substrate 10, electrodes formed on a front surface 10a and a rear surface 10b of the semiconductor substrate 10, insulators, and the like. Notably, in FIG. 1, a front surface electrode 70 and interlayer insulating film 74 provided on the front surface 10a (to be described later) are omitted.

Figure 2:
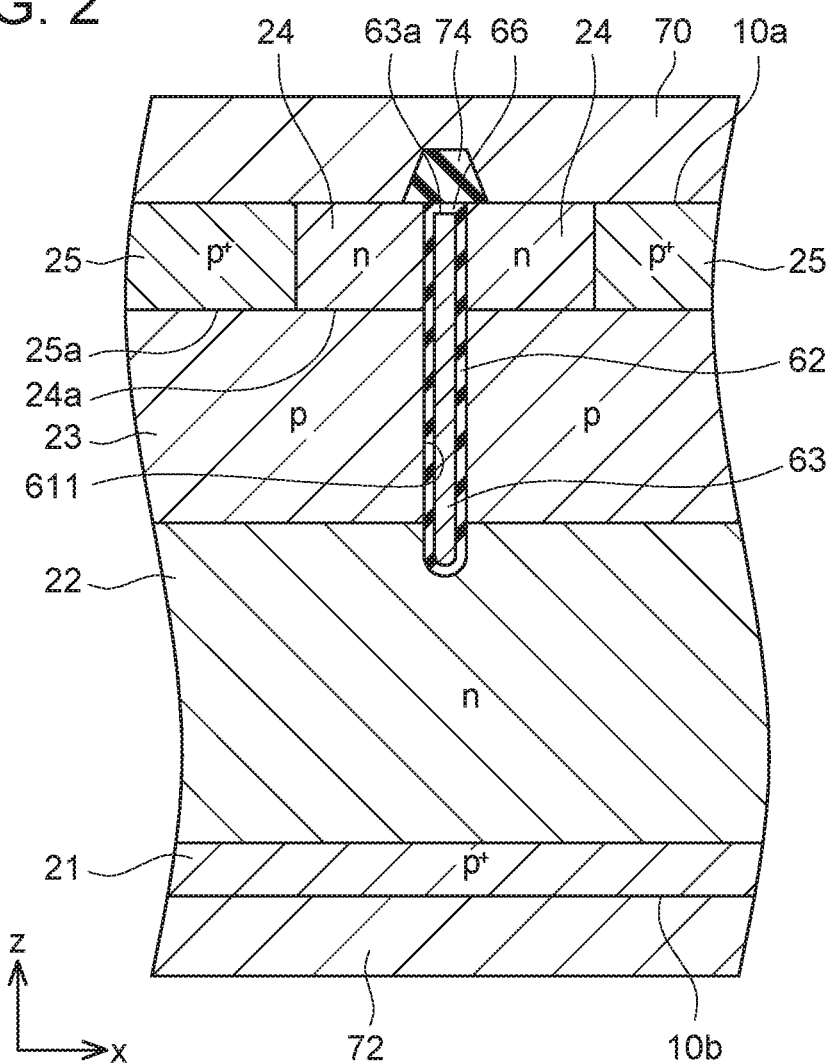
FIG. 2 is a II-II cross sectional view of FIG. 1.
Figure 3:
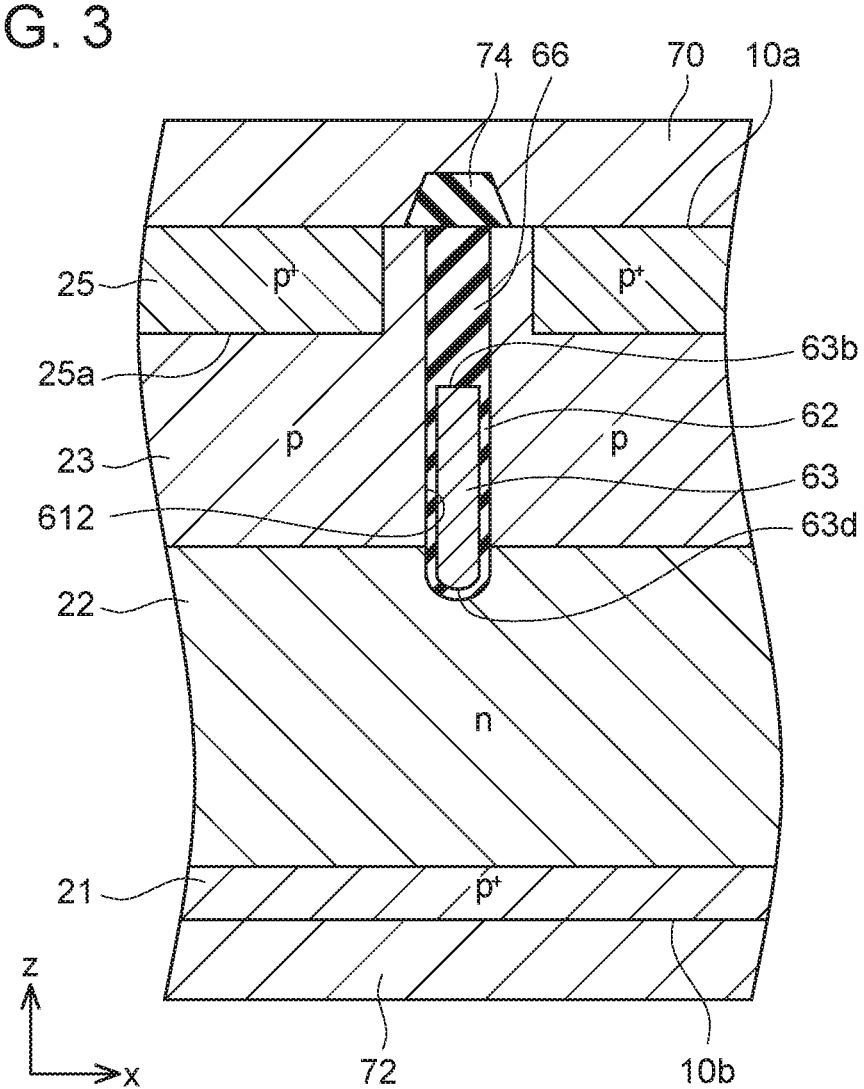
FIG. 3 is a III-III cross sectional view of FIG. 1.

The semiconductor substrate 10 is configured of silicon. As shown in FIG. 2, the semiconductor substrate 10 includes therein emitter regions 24 (an example of carrier-injected regions), contact regions 25, a body region 23, a drift region 22, and a collector region 21. More specifically, the semiconductor substrate 10 is provided, in this order from a rear surface 10b side, with the p-type collector region 21, the n-type drift region 22 disposed on the collector region 21, the p-type body region 23 disposed on the drift region 22, the n-type emitter regions 24 disposed on the body region 23, and the p-type contact regions 25 provided on the body region 23. The collector region 21 is exposed on the rear surface 10b. The collector region 21 is separated from the body region 23 by the drift region 22. The drift region 22 is separated from the emitter regions 24 by the body region 23. The emitter regions 24 and the contact regions 25 are respectively exposed on the front surface 10a. A p-type impurity concentration of the contact regions 25 is higher than a p-type impurity concentration of the body region 23. Further, as shown in FIGS. 1 and 3, the body region 23 is exposed on the front surface 10a around each contact region 25. Notably, the n type is an example of a first conductivity type, and the p type is an example of a second conductivity type.

A front surface electrode 70 is provided on the front surface 10a of the semiconductor substrate 10. The front surface electrode 70 is connected to the body region 23, the emitter regions 24, and the contact regions 25. A rear surface electrode 72 is provided on the rear surface 10b of the semiconductor substrate 10. The rear surface electrode 72 is connected to the collector region 21.

As shown in FIG. 1, a trench 61 extending from the front surface 10a toward the rear surface 10b is provided on the front surface 10a of the semiconductor substrate 10. The trench 61 includes first trench parts 611 extending in a y direction and second trench parts 612 extending in an x direction in a plan view of the front surface 10a. Notably, the y direction is a direction different from the x direction, and more specifically, the y direction is a direction that intersects orthogonally to the x direction. The trench 61 includes a plurality of the first trench parts 611 and a plurality of the second trench parts 612.

The plurality of the second trench parts 612 is arranged along the y direction with intervals in between each other. The plurality of the second trench parts 612 extends in parallel to each other. A width of the second trench parts 612 (that is, length in the y direction) is wider than a width of the first trench parts 611 (that is, length in the x direction).

The first trench parts 611 extend in the y direction. The plurality of the first trench parts 611 is arranged along the x direction with intervals in between each other. The plurality of the first trench parts 611 extends in parallel to each other. The first trench parts 611 that are adjacent one another in the y direction are offset from one another in the x direction. All of the first trench parts 611 intersect with the second trench parts 612 at intersecting parts 30 at both ends thereof. The trench 61 extends in three ways from each intersecting part 30. The front surface 10a is divided in a matrix by the first trench parts 611 and the second trench parts 612. Hereinbelow, each of the regions divided into a matrix is called a device region 20.

As shown in FIG. 1, two emitter regions 24 are provided in each device region 20. The emitter regions 24 appear intermittently when seen along the y direction. The two emitter regions 24 are each adjacent to the corresponding one of the two first trench parts 611 that defines the device region 20. More specifically, the emitter regions 24 are adjacent to the first trench parts 611 at sections excluding both ends of the first trench parts 611. Further, the emitter regions 24 are not adjacent to the second trench parts 612. That is, the emitter regions 24 are provided by being separated from the second trench parts 612. The body region 23 is formed to make contact with the first trench parts 611, the second trench parts 612, and the intersecting parts 30. The body region 23 is filled in a gap between the emitter regions 24 when seen along the y direction. The contact regions 25 are provided on inner circumferential sides of the body region 23.

As shown in FIGS. 2 and 3, the trench 61 (first trench parts 611 and second trench parts 612) extend in a z direction (depth direction) from the front surface 10a of the semiconductor substrate 10. As shown in FIG. 2, center portions of the first trench parts 611 extend to the drift region 22 by penetrating the emitter regions 24 and the body region 23. As shown in FIG. 3, both end parts of the trench parts 611 and the second trench parts 612 extend to the drift region 22 by penetrating the body region 23.

A gate insulating film 62 is provided on an inner surface of the trench 61. The gate insulating film 62 covers an entirety of the inner surface of the trench 61. The emitter regions 24, the body region 23, and the drift region 22 make contact with the gate insulating film 62. As shown in FIG. 2, the emitter regions 24 make contact with the gate insulating film 62 in vicinity of the front surface 10a. The body region 23 makes contact with the gate insulating film 62 on the rear surface 10b side of the emitter regions 24. Further, as shown in FIG. 3, at a position where the emitter regions 24 are not provided, the body region 23 makes contact with the gate insulating film 62 from the front surface 10a along the z direction (depth direction) of the trench 61. As shown in FIG. 1, the body region 23 makes contact with the first trench parts 611, the second trench parts 612, and the gate insulating film 62 in the intersecting parts 30. Further, the emitter regions 24 make contact with the gate insulating film 62 in a section excluding the both ends of the first trench parts 611. The emitter regions 24 do not make contact with the gate insulating film 62 in the second trench parts 612 and the intersecting parts 30. The drift region 22 makes contact with the gate insulating film 62 on the rear surface 10b side of the body region 23.

Figure 4:
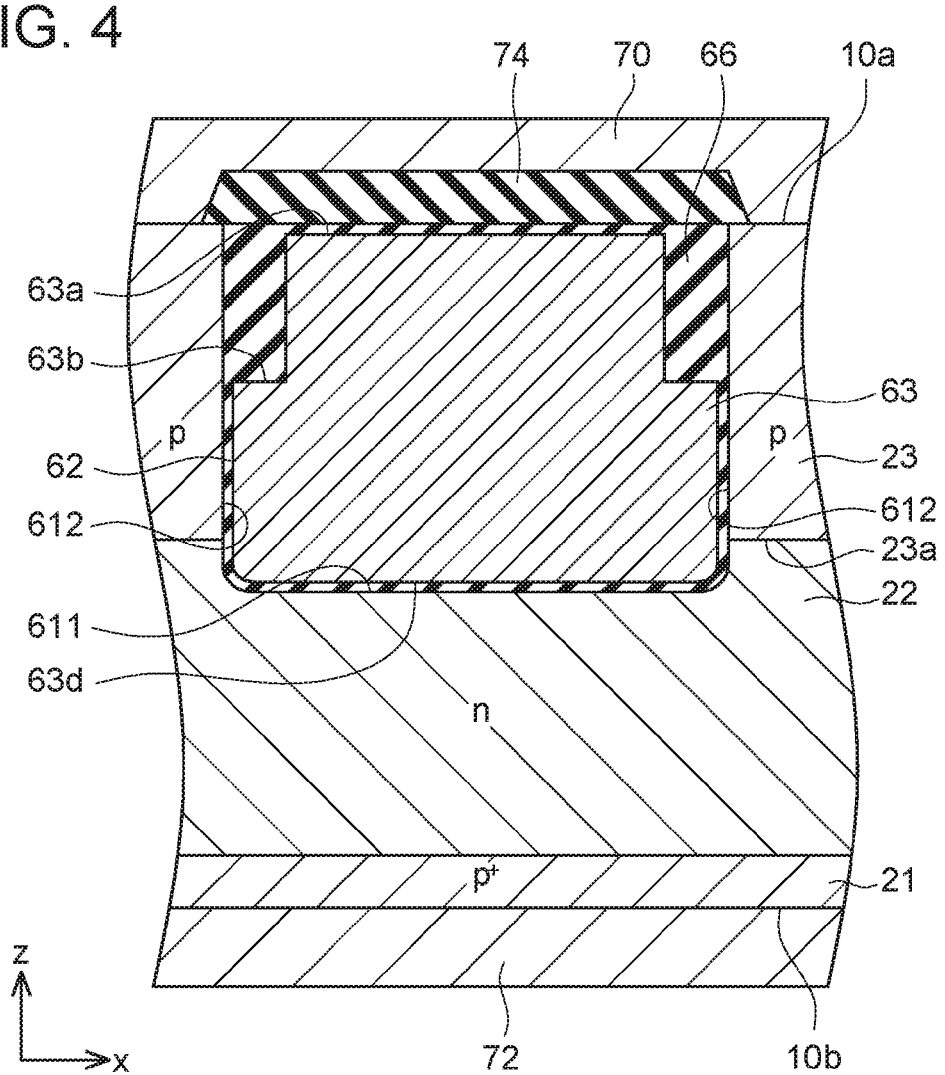
FIG. 4 is a IV-IV cross sectional view of FIG. 1.

A gate electrode 63 is provided inside the trench 61 (that is, inside the gate insulating film 62). The gate electrode 63 is arranged inside the first trench parts 611 and the second trench parts 612. As shown in FIG. 4, compared to an end surface 63a of the gate electrode 63 on the front surface 10a side in the first trench parts 611, an end surface 63b of the gate electrode 63 on the front surface 10a side in the second trench parts 612 is displaced to the rear surface 10b side. Due to this, the end surface 63b is positioned on the rear surface 10b side than the end surface 63a. On the other hand, the end surface 63b is positioned on the front surface 10a side than a rear surface 23a of the body region 23. As shown in FIGS. 2 and 3, the end surface 63b is positioned on the rear surface 10b side than rear surfaces 25a of the contact regions 25 and rear surfaces 24a of the emitter regions 24. The gate electrode 63 in the second trench parts 612 opposes the body region 23 and the drift region 22 via the gate insulating film 62. The gate electrode 63 at the center portions of the first trench parts 611 opposes the emitter regions 24, the body region 23, and the drift region 22 via the gate insulating film 62. The gate electrode 63 at both end parts of the first trench parts 611 opposes the body region 23 and the drift region 22 via the gate insulating film 62.

The end surfaces 63a, 63b of the gate electrode 63 are covered by an end surface insulating film 66. The end surface insulating film 66 on the end surface 63b is thicker than the end surface insulating film 66 on the end surface 63a. A front surface of the end surface insulating film 66 is positioned on a same plane as the front surface 10a over its entirety. An interlayer insulating film 74 is arranged on the front surface of the end surface insulating film 66. The gate electrode 63 is insulated from the front surface electrode 70 by the interlayer insulating film 74 and the end surface insulating film 66.

As shown in FIG. 1, each second trench part 612 includes a width changing portion 612a and a narrow width portion 612b at an outer circumferential portion of the semiconductor substrate 10. The width changing portions 612a are connected to one ends of center portions of the second trench parts 612 (that is, left side in FIG. 1) where the width is relatively wide (hereinbelow referred to as "wide width portions 612c"). In the width changing portions 612a, the width of the second trench parts 612 changes so as to become gradually narrow from the one ends of the wide width portions 612c toward a circumferential end of the semiconductor substrate 10 (that is, right side in FIG. 1). The narrow width portions 612b are positioned on the ends on the opposite side from the wide width portions 612c of the width changing portions 612a. The width of the narrow width portions 612b has the same width as the ends of the width changing portions 612a on the opposite side from the wide width portions 612c, and is narrower than the width of the wide width portions 612c.

Figure 5:
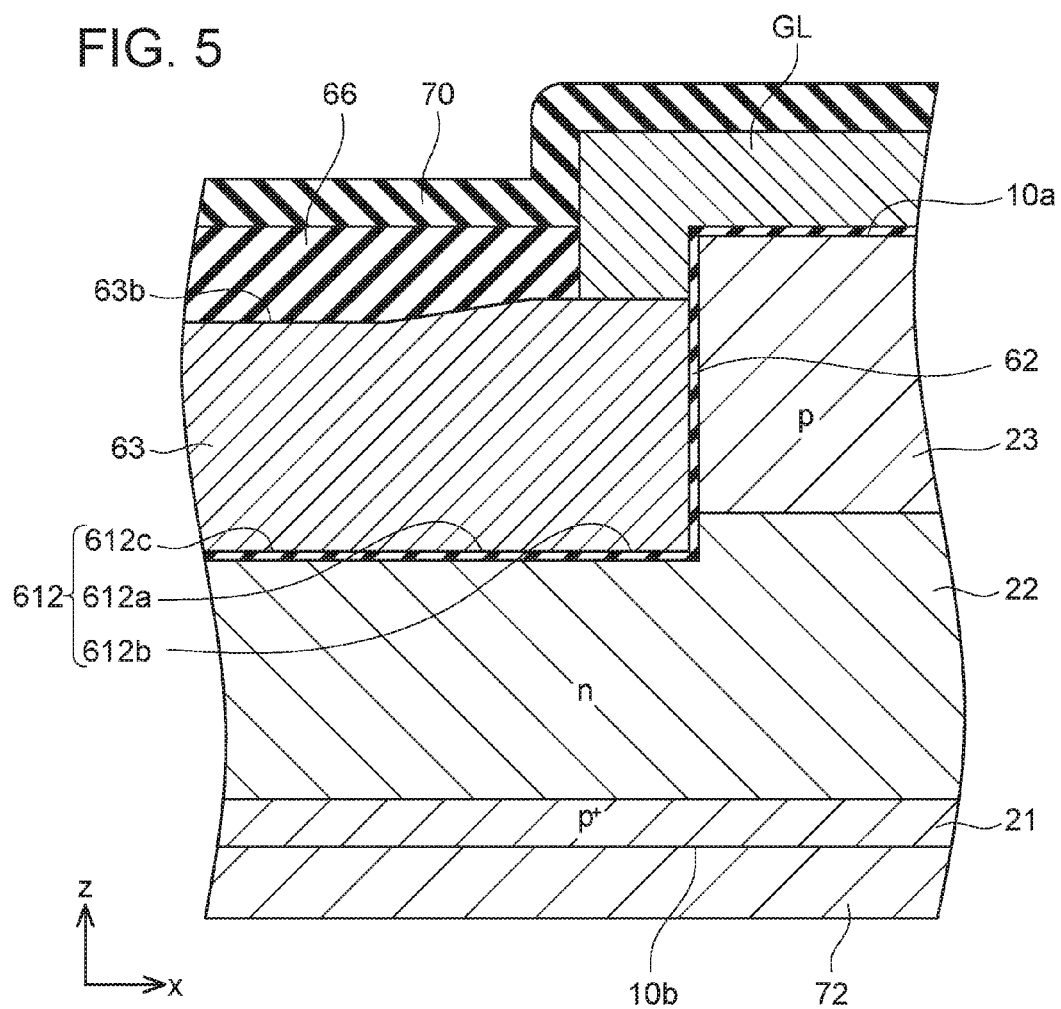
FIG. 5 is a V-V cross sectional view of FIG. 1.

As shown in FIG. 5, in each width changing portion 612a, the end surface 63b of the gate electrode 63 approaches gradually to the front surface 10a as the width of the second trench part 612 becomes narrower. Then, the end surface 63b in the narrow width portion 612b is positioned on the front surface 10a side than the end surface 63b in the wide width portion 612c. The gate electrode 63 in the narrow width portion 612b has a gate wiring GL connected to the end surface 63b.

In the semiconductor device 1, when the gate electrode 63 in the trench 61 is brought to be at an ON potential (potential equal to or greater than a threshold), charges are stored in the gate electrode 63. When the charges in the gate electrode 63 reach a predetermined amount, a channel is formed in the body region 23 in vicinity of the gate insulating film 62. When a voltage is applied between the :front surface electrode 70 and the rear surface electrode 72 in the state where the channel is being formed, electrons flow from an emitter region 24 side to the collector region 21 through the channel and the drift region 22. Further, holes flow from the collector region 21 to the contact regions 25 through the drift region 22 and the body region 23. Accordingly, current flows from the collector region 21 to the emitter regions 24. That is, the IGBT is turned on.

A gate capacitance of the semiconductor device 1 changes among the opposing areas of the gate electrode 63 with the body region 23 and the emitter regions 24. In the semiconductor device 1, the end surface 63b of the gate electrode 63 in the second trench parts 612 is positioned on the rear surface 10b side than the end surface 63a of the gate electrode 63 in the first trench parts 611. According to this configuration, as compared to the configuration in which the end surface 63b is positioned on the same height as the end surface 63a, the opposing area of the gate electrode 63 with the body region 23 can be made smaller at both end parts of the second trench parts 612 and the first trench parts 611. Due to this, the gate capacitance can be reduced, and a charge amount (that is, the gate-input charge amount) required to turn on the IGBT can be reduced.

Further, in the above semiconductor device 1, the emitter regions 24, the body region 23 and the drift region 22 oppose the gate electrode 63 via the gate insulating film 62 in this order from the front surface 10a toward the rear surface 10b at the center portions of the first trench parts 611. Due to this, the emitter regions 24 and the drift region 22 can be connected by the channel formed in the body region 23. Due to this, the current flows in the channel, and the IGBT turns on. On the other hand, at the both ends of the second trench parts 612 and of the first trench parts 611, the end surface 63b of the gate electrode 63 is positioned on the rear surface 10b side than the emitter regions 24 making contact with the gate insulating an 62 in the first trench parts 611. Due to this, the channel is formed on the rear surface 10b side than the surfaces of the emitter regions 24 on the rear surface side lob. However, since the emitter regions 24 do not oppose the gate electrode 63 via the gate insulating film 62 at the both ends of the second trench parts 612 and of the first trench parts 611, current hardly flows regardless of the presence or absence of the channel. Thus, even if the channel is formed only on the rear surface 10b side of the body region 23, this hardly affects the performance of the semiconductor device 1.

As above, in the second trench parts 612 making contact with the body region 23 where the current hardly flows regardless of the presence or absence of the channel, the gate capacitance can be reduced without deteriorating the performance of the semiconductor device 1 by arranging the end surface 63b of the gate electrode 63 on the rear surface 10b side.

Further, in the semiconductor device 1, the gate electrode 63 is arranged also in the second trench parts 612 where the current between the emitter regions 24 and the collector region 21 hardly flows. According to this configuration, an electric field generated in the drift region 22 upon when the voltage applied to the gate electrode 63 is turned off can be prevented from accumulating in a periphery of the gate electrode 63.

Figure 6:
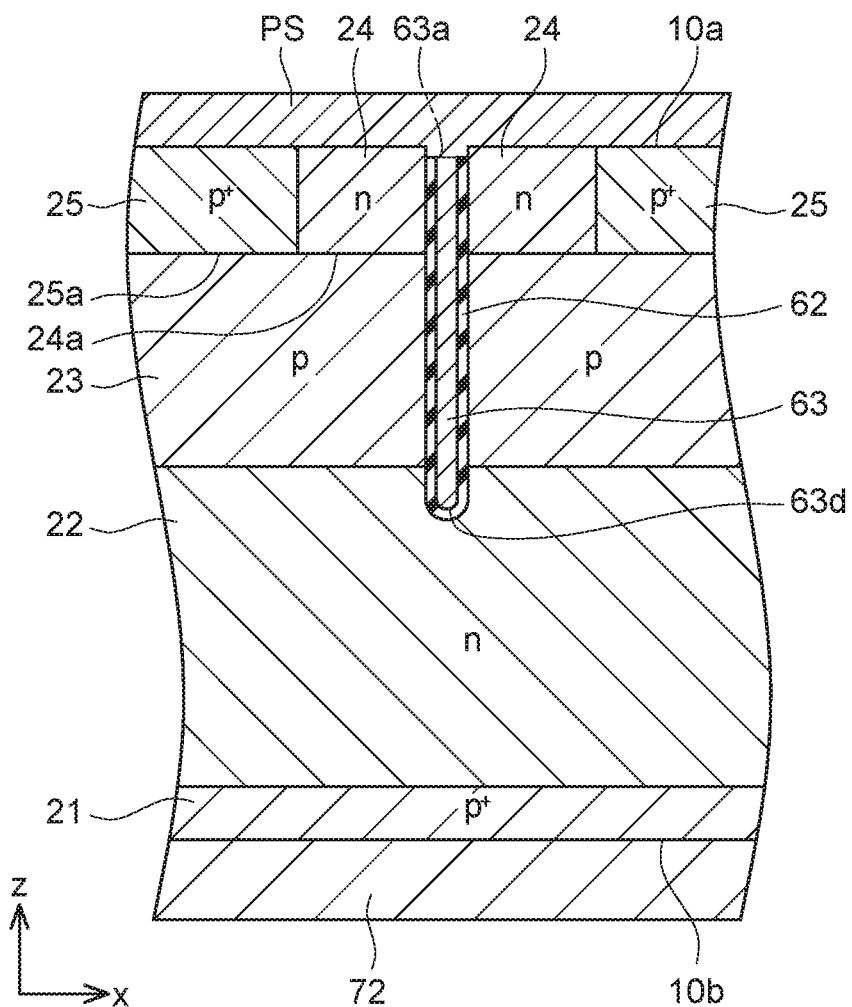
FIG. 6 is a cross sectional view explaining a filling process of gate electrodes in the II-II cross sectional view of FIG. 1.
Figure 7:
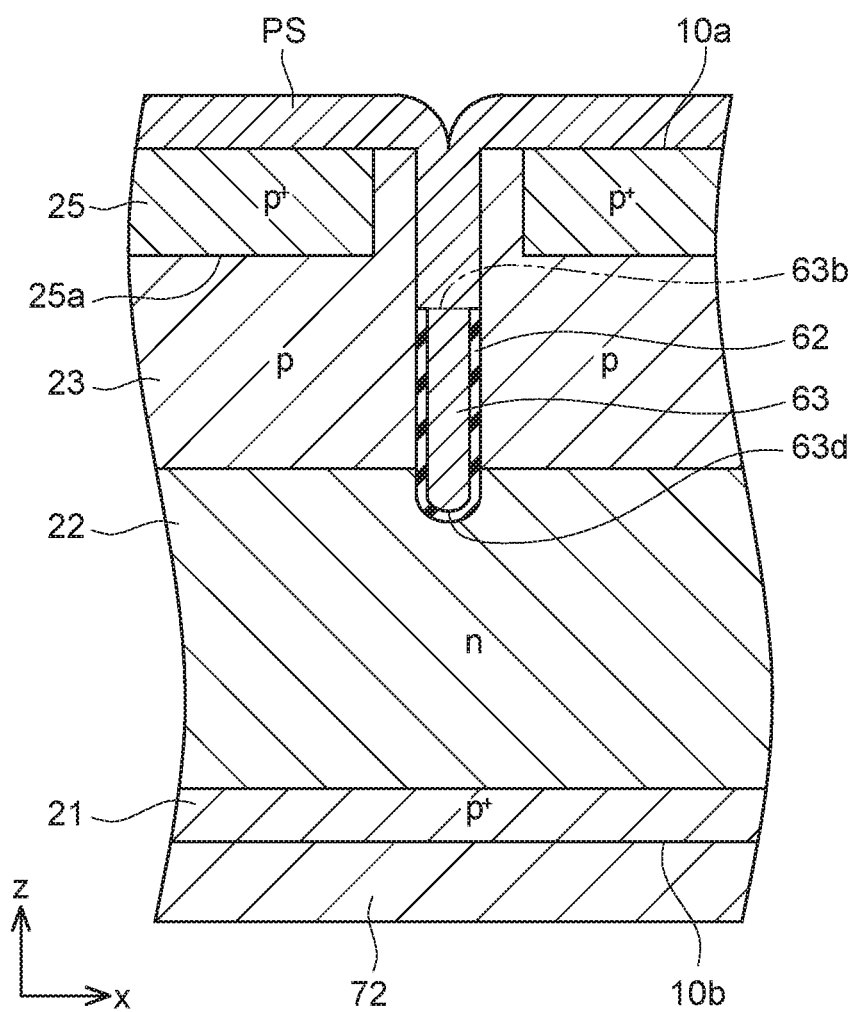
FIG. 7 is a cross sectional view explaining a filling process of gate electrodes in the III-III cross sectional view of FIG. 1.

Next, by referring to FIG. 6 and FIG. 7, a process of forming the gate electrode 63 in the semiconductor substrate 10 will be described. Polysilicon PS being a material of the gate electrode 63 is deposited on the front surface 10a of the semiconductor substrate 10 by using CVD (abbreviation of Chemical Vapor Deposition) on the semiconductor substrate 10 in which the trench 61 and the gate insulating film 62 have been formed. Polysilicon PS is deposited also on the gate insulating film 62 in the trench 61. As shown in FIG. 6, the CVD is carried out until a front surface of the polysilicon PS at the first trench parts 611 becomes substantially flat.

On the other hand, the second trench parts 612 are wider than the first trench parts 611. Due to this, as shown in FIG. 7, in a state where the front surface of the polysilicon PS arranged in the first trench parts 611 and on the front surface 10a of the semiconductor substrate 10 is formed substantially flat (that is, the state shown in FIG. 6), the front surface of the polysilicon PS arranged in the second trench parts 612 is recessed at center portions of the width direction of the second trench parts 612.

Further, at the outer circumferential portion of the semiconductor substrate 10, the width of each second trench part 612 is narrowed from the wide width portion 612c toward the narrow width portion 612b with the width changing portion 612a in between. Due to this, the front surface of the polysilicon PS in each width changing portion 612a has the recess in the center potion that gradually becomes shallower from the wide width portion 612c toward the narrow width portion 612b.

Next, the polysilicon PS on the front surface 10a of the semiconductor substrate 10 is removed by etching. As shown in FIG. 6, the etching is carried out until the front surface of the polysilicon PS in the first trench parts 611, that is, the end surface 63a of the gate electrode 63, comes to be located somewhat on the rear surface 10b side than the front surface 10a. As shown in FIG. 7, since the front surface of the polysilicon PS in the second trench parts 612 is recessed at the center portions in the width direction of the second trench parts 612, the front surface of the polysilicon PS on the second trench parts 612, that is, the end surface 63b of the gate electrode 63, is positioned on the rear surface side 10b of the semiconductor substrate 10 than the front surface of the polysilicon PS in the first trench parts 611, that is, the end surface 63a of the gate electrode 63, after the etching. According to this configuration, the width of the second trench parts 612 is made wider than the width of the first trench parts 611 so that the end surface 63b can be arranged easily on the rear surface side 10b of the semiconductor substrate 10 than the end surface 63a.

Further, after the etching, the front surface of the polysilicon PS, that is, the end surface 63b of the gate electrode 63, approaches closer to the front surface 10a from the wide width portion 612c toward the narrow width portion 612b. By narrowing the width of each second trench part 612 from the wide width portion 612c toward the narrow width portion 612b with the width changing portion 612a in between, the position of the end surface 63b of the gate electrode 63 can easily be caused to approach the front surface 10a.

When the gate electrode 63 is formed, the gate wirings GL (see FIG. 5) are arranged. The gate wirings GL extend from the front surface 10a of the semiconductor substrate 10 toward the end surface 63b of the gate electrode 63. When a step difference between the front surface 10a and the end surface 63b is large, a pattern of the gate wirings GL becomes unstable. In the semiconductor device 1, the step difference between the front surface 10a and the end surface 63b can be made small by causing the end surface 63b of the gate electrode 63 to approach the front surface 10a, and the pattern of the gate wirings GL can be stabilized.

Second Embodiment

A semiconductor device 201 of a second embodiment shown in FIG. 8 and FIG. 9 will be described. In the semiconductor device 1 of the first embodiment, the gate wirings GL make contact with the end surface 63b of the gate electrode 63 in the second trench parts 612 of the trench 61. In the semiconductor device 201 of the second embodiment, the gate wirings GL make contact with the end surface 63a of the gate electrode 63 in the first trench parts 611 of the trench 61.

Figure 8:
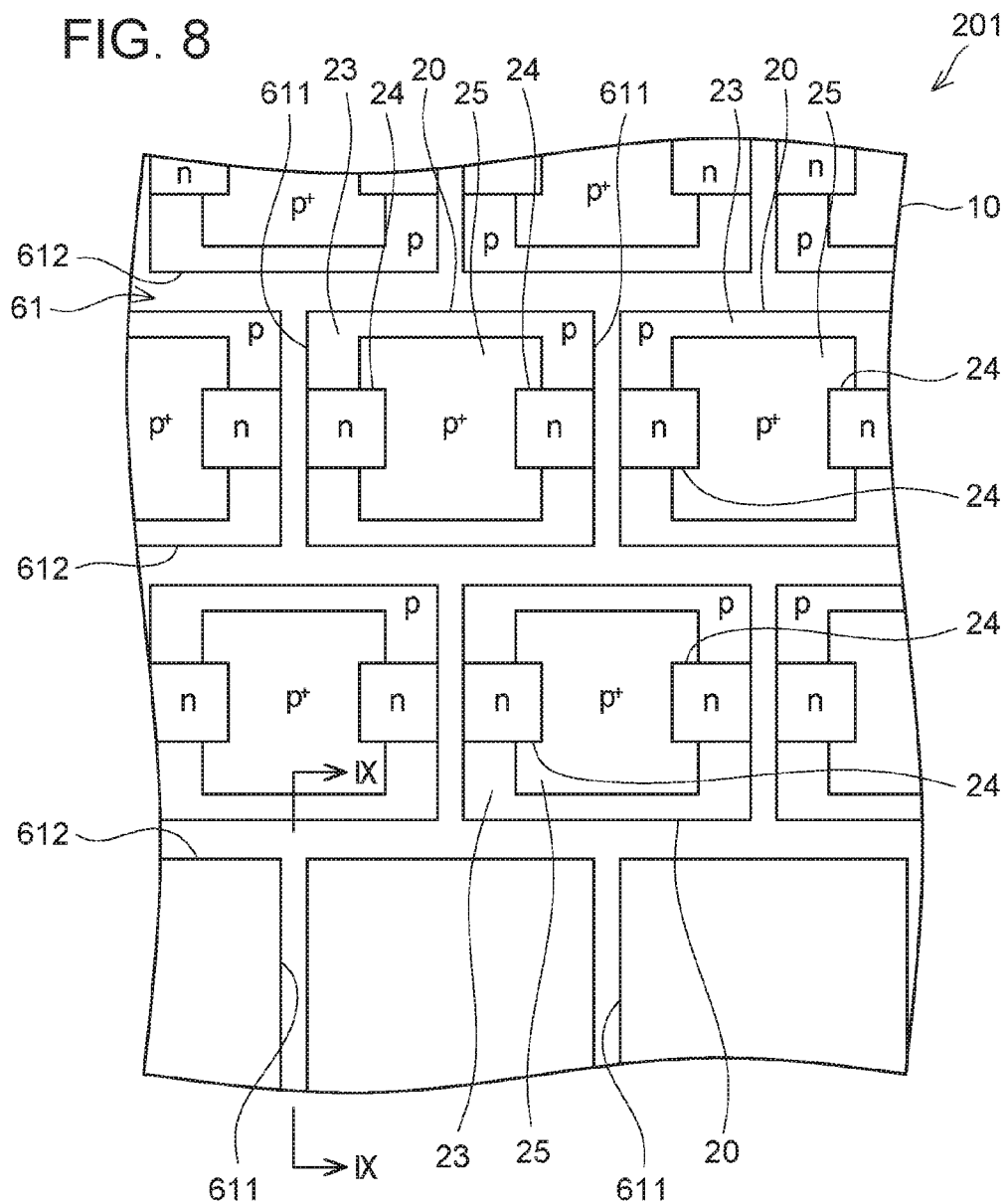
FIG. 8 is a plan view of a semiconductor device of a second embodiment.
Figure 9:
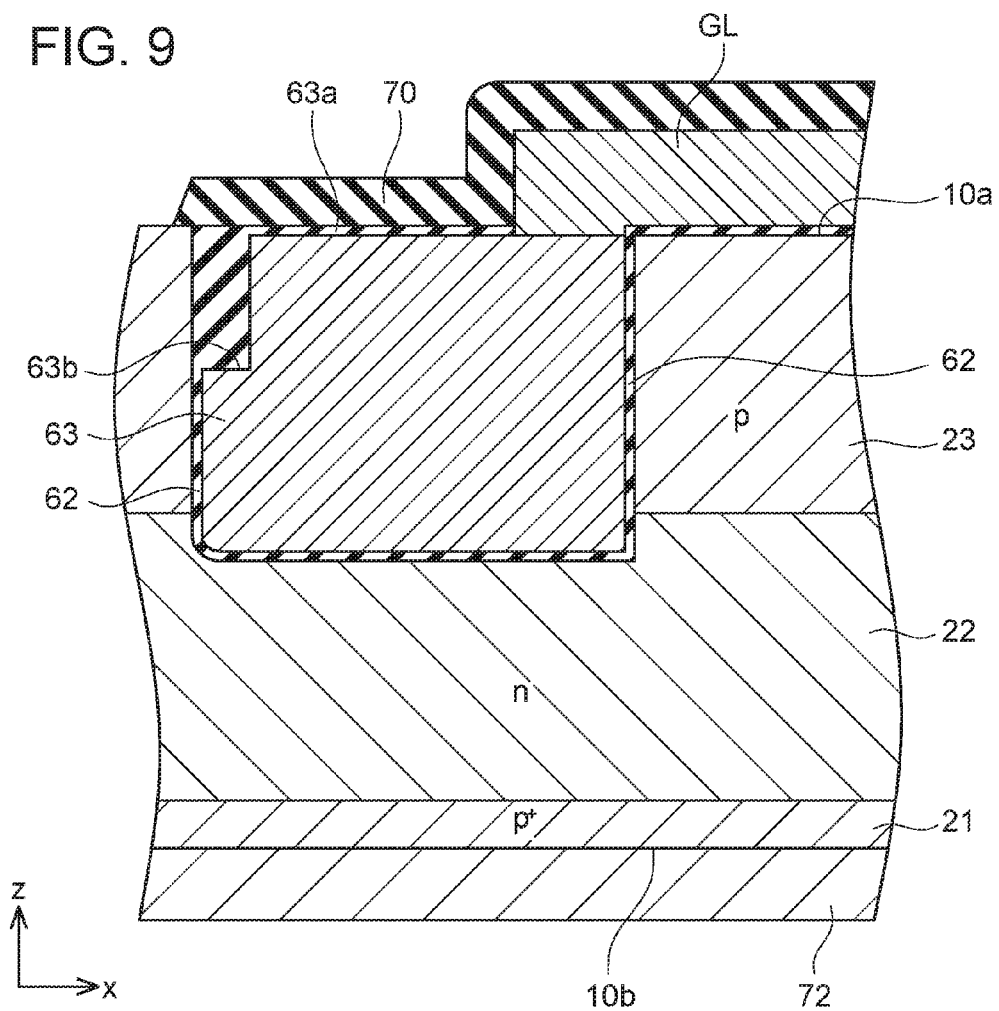
FIG. 9 is a IX-IX cross sectional view of FIG. 8.

As shown in FIG. 8, the first trench parts 611 extend toward a circumferential end of the semiconductor substrate 10 (lower end in FIG. 8). As shown in FIG. 9, in the first trench parts 611, the end surface 63a of the gate electrode 63 is positioned on the front surface 10a side of the semiconductor substrate 10 than the end surface 63b of the gate electrode 63 in the second trench parts 612. The gate wirings GI, are connected to the gate electrode 63 by making contact with the end surface 63a of the gate electrode 63. According to this configuration, in order to connect the gate wirings GL to the gate electrode 63, the gate wirings GL can be connected to the gate electrode 63 without extending them to the rear surface 10b side of the semiconductor substrate 10. Due to this, the pattern of the gate wirings GL can be stabilized.

As above, the specific embodiments of the present invention were described in detail, however, these are mere examples and do not restrict the scope of the claims. The art described in the claims includes various modifications and alternatives of the above-described specific embodiments.

For example, the semiconductor device disclosed herein may be, other than the IGBT provided with the trench 61 including the first trench parts 611 and the second trench parts 612, an IGBT that is provided with a trench 61 that includes the second trench parts 612 but does not include the first trench parts 611, that is, the trench 61 that extends along the y direction. In this case, the plurality of emitter regions 24 may be arranged at regular intervals along the y direction. In this case, within the trench 61, the front surface of the gate electrode 63 on the front surface 10a side in a second section where it does not make contact with any emitter region 24 may be positioned on the rear surface 10b side than the front surface of the gate electrode 63 on the front surface side 10a in a first section where it makes contact with the emitter region 24. Further, a width of the trench 61 in the first section may be wider than a width of the trench 61 in the second section.

Further, other than being an IGBT, the semiconductor device disclosed herein may be a MOSFET (abbreviation of Metal-Oxide-Semiconductor Field Effect Transistor).

Further, in the above embodiments, the positions of the end surfaces 63a, 63b of the gate electrode 63 are changed by causing the width of the trench 61 to change. However, the width of the trench 61 may be constant. In this case, the positions of the end surfaces 63a, 63b may be changed by etching that takes place after having filled the polysilicon in the trench 61.

Further, in the above embodiments, the entirety of the end surface 63b of the gate electrode 63 in the second trench parts 612 is located on the rear surface 10b side of the semiconductor substrate 10 than the end surface 63a of the gate electrode 63 in the first trench parts 611. However, an entirety of a part of the end surface 63b of the gate electrode 63 in the second trench parts 612 may be positioned on a same plane as the end surface 63a of the gate electrode 63 in the first trench parts 611.

Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

In the semiconductor device of the above embodiments, the first end surface may be located closer to the front surface than end surfaces of the carrier-injected regions, the end surfaces being located on the rear surface side within the carrier-injected regions. The second end surface may be located closer to the rear surface than the end surfaces of the carrier-injected regions. According to this configuration, the opposing area between the gate electrode and the body region can be decreased.

The second end surface may be located closer to the front surface than an end surface of the second conductive type body region, the end surface being located on the rear surface side within the body region. According to this configuration, reduction in electron accumulating effect caused by the drift region positioned on the rear surface side of the body region opposing the gate electrode can be suppressed.

X-direction and y-direction may be defined to extend along the one front surface and orthogonally intersect each other. The trench may include a part extending along the x-direction and a part extending along the y-direction. The carrier-injected regions may be in contact with the gate insulating film at the part extending along the y-direction. The second end surface may be positioned in the part extending along the x-direction. The first end surface may be positioned in the part extending along the y-direction. According to this configuration, in the semiconductor device in which the trench includes two parts extending respectively in the x and y directions, the gate-input charge amount can be reduced without decreasing the semiconductor device performance.

In the trench, a width of the part extending along the x-direction is wider than a width of the part extending along the y-direction. In this configuration, by performing the following processes, the front end surface of the gate electrode at the part extending in the x direction can easily be displaced to the rear surface side relative to the front end surface of the gate electrode at the part extending in the y direction. That is, in the filling process of filling the gate electrode material in the trench, the filling process is terminated at a timing when the gate electrode material is suitably filled in the part extending in the y direction. At such a timing when the filling process is terminated, the gate electrode material is not sufficiently deposited above the wide part extending in the x direction, so a center potion of the part extending in the x direction in the width direction is recessed. By uniformly etching the unnecessary gate electrode material on the semiconductor substrate after the filling process, the front end surface of the gate electrode at the part extending in the x direction can be located on the rear surface side of the semiconductor substrate than the front end surface of the gate electrode at the part extending in the y direction.

The trench may include a width-changing portion. A width of the width-changing portion may gradually change from a wide portion to a narrow portion. The front end surface of the gate electrode may be positioned on the rear surface side in the wide portion and positioned on the front surface side in the narrow portion, and gradually shifts from the rear surface side to the front surface side in the width changing portion. A gate wire may be connected to the front surface side end surface of the gate electrode that is displaced to the front surface side in the narrow portion, the gate wire extending outside of the trench. According to this configuration, the gate electrode can suitably be connected to a gate wiring outside the trench at the part where the end surface of the gate electrode is displaced to the front surface side of the semiconductor substrate.

What is claimed is:

1. A semiconductor device, comprising:
   a trench extending from a front surface of a semiconductor substrate toward a rear surface of the semiconductor substrate, and extending in a predetermined direction in a plan view of the semiconductor device;
   a gate insulating film covering a bottom surface and a side surface of the trench; first conductive type carrier-injected regions being in contact with the side surface of the trench that is located on a front surface side, and intermittently appearing as seen along the predetermined direction; a first conductive type drift region being in contact with the bottom surface and the side surface of the trench that is located on a rear surface side, and continuously present as seen along the predetermined direction; a second conductive type body region disposed between the first conductive type carrier-injected regions and the first conductive type drift region and separating the first conductive type carrier-injected regions and the first conductive type drift region, and filling a gap between the first conductive type carrier-injected regions as seen along the predetermined direction; and
   a gate electrode disposed in the trench having the bottom surface and the side surface covered by the gate insulating film, wherein the gate electrode has a front end surface located on the front surface side of the trench, the front end surface including: a first end surface that is at a portion of the gate electrode opposing the first conductive type carrier-injected regions via the gate insulating film, and a second end surface that is at least a part of a portion of the gate electrode opposing the second conductive type body region in the gap, and the second end surface is displaced to the rear surface side relative to the first end surface,
   wherein the trench includes a width-changing portion, a width of the width-changing portion gradually changes from a wide portion to a narrow portion, the front end surface of the gate electrode is positioned on the rear surface side in the wide portion and positioned on the front surface side in the narrow portion, and gradually shifts from the rear surface side to the front surface side in the width changing portion, and a gate wire is connected to the front surface side end surface of the gate electrode that is displaced to the front surface side in the narrow portion, the gate wire extending outside of the trench.

2. The semiconductor device of claim 1, wherein the first end surface is located closer to the front surface than end surfaces of the carrier-injected regions, the end surfaces being located on the rear surface side within the carrier-injected regions, and the second end surface is located closer to the rear surface than the end surfaces of the carrier-injected regions.

3. The semiconductor device of claim 1, wherein the second end surface is located closer to the front surface than an end surface of the body region, the end surface of the body region being located on the rear surface side within the body region.

4. The semiconductor device of claim 1, wherein x-direction and y-direction are defined to extend along the front surface and orthogonally intersect each other, the trench includes a part extending along the x-direction and a part extending along the y-direction, the carrier-injected regions are in contact with the gate insulating film at the part extending along the y-direction, and the second end surface is positioned in the part extending along the x-direction, and the first end surface is positioned in the part extending along the y-direction.

5. The semiconductor device of claim 4, wherein in the trench, a width of the part extending along the x-direction is wider than a width of the part extending along the y-direction.

* * * * *